United States Patent
Nagasaka et al.

(10) Patent No.: US 6,767,657 B1
(45) Date of Patent: Jul. 27, 2004

(54) SLIDING MEMBER AND MANUFACTURING METHOD THEREFOR

(75) Inventors: Hiroshi Nagasaka, Kanagawa (JP);
Momoko Kakutani, Kanagawa (JP);
Matsuho Miyasaka, Kanagawa (JP);
Tadashi Kataoka, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/807,436
(22) PCT Filed: Oct. 22, 1999
(86) PCT No.: PCT/JP99/05838
§ 371 (c)(1), (2), (4) Date: Jun. 26, 2001
(87) PCT Pub. No.: WO00/24947
PCT Pub. Date: May 4, 2000

(30) Foreign Application Priority Data

Oct. 23, 1998 (JP) ............................ 10-302259
Oct. 23, 1998 (JP) ............................ 10-302260

(51) Int. Cl.$^7$ .......................... C23C 14/06; B23F 15/28
(52) U.S. Cl. ...................... 428/698; 428/325; 428/469; 428/472; 428/697; 428/699
(58) Field of Search ............................ 428/698, 325, 428/697, 699, 472, 469, 704, 657; 204/192.34, 192.11

(56) References Cited

U.S. PATENT DOCUMENTS

| | | | |
|---|---|---|---|
| 4,753,854 A | * | 6/1988 | Gavrilov et al. |
| 5,624,766 A | * | 4/1997 | Moriguchi et al. |
| 5,700,551 A | * | 12/1997 | Kukino et al. |
| 5,731,079 A | | 3/1998 | Hammond et al. |
| 5,981,078 A | * | 11/1999 | Tabersky et al. |

FOREIGN PATENT DOCUMENTS

| | | | |
|---|---|---|---|
| DE | 4317758 | * | 12/1994 |
| EP | 0 166 349 A1 | | 1/1986 |
| EP | 0 685 439 A2 | | 12/1995 |
| JP | 55120936 | * | 9/1980 |
| JP | 06017228 | * | 1/1994 |

OTHER PUBLICATIONS

Münz et al.; Journal of Vacuum Science & Technology, vol. 4, No. 6, pp. 2717–2752, Nov. 1986. See PCT search report.
Vaz et al.; Surface & Coating Technology, Elsevier, vol. 108–109 pp. 236–240, Oct. 1998. See PCT search report.
Sun et al.; Journal of Applied Physics, U.S. American Institute of Physics, vol. 81, No. 2, pp. 656–663, Jan. 1997. See PCT search report.
Takano et al.; Surface & Coating Technology, Elsevier, vol. 84, No. 1–2, pp. 409–413, Oct. 1996. See PCT search report.
Shew et al.; Thin Solid Films, Elsevier, vol. 293, No. 1–2, pp. 212–219, 1997. See PCT search report.
Patent Abstract of Japan, Publication No. 05250770, Sep. 28, 1993. See PCT search rpt.

* cited by examiner

Primary Examiner—Archene Turner
(74) Attorney, Agent, or Firm—Westerman, Hattori, Daniels & Adrian, LLP

(57) ABSTRACT

This invention relates to a hard coating developed for applications involving high-temperature corrosion by improving the performance of TiN coatings while retaining the superior wear resistance and low friction coefficent of TiN itself. The nitride-based sliding material has a face-centered cubic crystalline structure with lattice constant of between 0.414 and 0.423 nm, and is made of mostly TiN but contains at least one element selected from the group containing Al, Cr, Zr and Hf; or comprises a nitride-based material containing substantially titanium nitride and at least one element selected from a group consisting of B and Si, and having a face-centered cubic crystalline structure comprising crystallites of an average size of not more than 9 nm.

12 Claims, 5 Drawing Sheets

SLIDING MEMBER AND MANUFACTURING METHOD THEREFOR

TECHNICAL FIELD

This invention relates to a high-temperature sliding member and a method for manufacturing the sliding member for use in bearings and seals in high-temperature rotating machines such as steam turbines and gas turbines, or to a sliding member that is suitable for applications requiring wear resistance and low friction such as cutting tools.

BACKGROUND ART

Application of a ceramic coating to improve wear resistance and corrosion resistance of bearings and seals made of metal materials is widely practiced. Materials used for making such ceramic coatings include titanium nitrides (TiN), titanium carbides (TiC), chromium nitrides (CrN), boron nitrides (BN), and diamond-like carbon (DLC). Among these, TiN and CrN are already widely applied industrially as hard coatings on metal molds and cutting tools.

As conventional methods for making such hard coatings, following surface improvement techniques are on the table: ion plating method including physical vapor deposition (PVD) or chemical vapor deposition (CVD), sputter deposition, plasma CVD and ion implantation. In particular, dynamic ion beam mixing (DM) method, which combines the vapor deposition method with the ion implantation technology is receiving keen interest, because the coating can bond tightly to the substrate and the coatings can be produced at low processing temperatures.

One of the ceramic coatings that is widely in use is TiN, which is a typical substance forming an interstitial solid solution compound, is known to have a face-centered cubic crystalline structure. TiN has a NaCl type crystalline structure where nitrogen atoms enter in the lattices formed of Ti. The composition range of TiNx is as broad as $0.8<x<1.16$, and when x is changed within this range, the lattice spacing of TiN is altered. Because of the superior resistance to wear and corrosion, TiN coating is also being used in bearings or seal components.

For application to rotating machines operating at high temperatures, such as steam turbines and gas turbines, there has been a need for hard coatings having a superior wear resistance, a high temperature corrosion resistance as well as superior high temperature sliding properties, as operating temperatures become higher in practice today. TiN coating is being considered for such applications, but it is known from experimental results to date that, because of insufficient corrosion resistance at high temperatures of TiN coating itself, durability of TiN coating has been in doubt when TiN coating is to be exposed to high-temperature air atmosphere or high-temperature steam. Therefore, the current state of art of TiN does not permit the use of TiN coating for such applications.

Also, for general purpose rotating machines such as pumps, there has been a tendency to increase rotational speed and operating pressure, resulting in a need for sliding components that can withstand severe operating conditions of high loads and high peripheral speeds. Conventional TiN coatings has become known to be inappropriate for such applications that present severe sliding conditions, because of inadequate hardness and wear resistance of TiN coating itself.

DISCLOSURE OF INVENTION

This invention was made to solve the problems outlined above, and an object is to provide a sliding member that can resist high-temperature corrosion while retaining the superior wear resistance and low frictional properties of TiN coating. Another object is to provide a sliding member having superior sliding properties to meet the needs of rotating machines operating at high rotational speeds and high pressures, by further improving the superior wear resistance and low frictional properties of TiN coating.

This invention relates to a sliding member comprising a substrate and a hard coating formed on the substrate, wherein the hard coating comprises a nitride-based material containing substantially TiN and at least one element selected from the group consisting of Al, Cr, Zr and Hf, and having a face-centered cubic crystalline structure with a lattice constant ranging from 0.414 to 0.423 nm in a crystal of the nitride-based material.

For the purpose of improving the resistance of TiN coatings to high temperature corrosion and oxidation, the inventors have been investigating technologies for obtaining nitride-based coatings containing elements other than Ti and N as well as methods for producing such products. That is, the primary object is to improve the resistance to high-temperature corrosion without losing the excellent sliding properties of TiN (wear resistance and low friction coefficient) by developing technologies for producing nitride-based thin films containing elements other than Ti and N. The result is a discovery that such a material has a face-centered cubic crystalline structure and contains substantially TiN and at least one element selected from the group containing Al, Cr, Zr and Hf, and that the lattice constant should be less than 0.423 nm, because if it exceeds this value, Vickers hardness becomes no more than 2000 and wear resistance becomes insufficient. These materials may also be used generally where sliding resistant properties are required.

It is suggested that a nitride-based material of this invention, which substantially comprises TiN but also containing at least one of Al, Cr, Zr and Hf, is a material in which some sites of Ti in a face-centered cubic crystalline structure is substituted by at least one of the elements selected from the group consisting of Al, Cr, Zr and Hf, and also has a face-centered cubic crystalline structure.

Investigations to date have demonstrated that the object is achieved when the nitride-based material has a face-centered cubic crystalline structure, the lattice constant is between 0.414 to 0.423 nm, the Vickers hardness of the material is not less than 2500 when the crystallite size of the nitride-based material is optimized, and has the following composition, excepting inevitable impurities such as carbon, oxygen, etc.

A preferable chemical composition of a sliding member made of the nitride-based material is defined in a formula, excepting inevitable impurities: $Ti_{(100-x)}Me_x$ nitride compound, where Me represents at least one element selected from the group consisting of Al, Cr, Zr and Hf, and x is in a range given by a relation: 2 atomic % $\leq x \leq 30$ atomic %.

Such a member may be made by the DM method, which allows metallic elements, Ti and additives, to be vapor deposited on a substrate in a vacuum while implanting nitrogen ions into the deposit. This method enables to produce a coated product having the coating adhering tightly to the substrate in a relatively low temperature process. It is preferable that the substrate have a low coefficient of thermal expansion of not more than $11 \times 10_{-6}$ so as to produce tight bonding, which can be met by stainless steels, such as SUS420J2 or SUS630, or nickel-based alloys such as Incoloy 909.

It is preferable that the acceleration voltage for the ion beam be less than 40 kV, because a higher acceleration voltage requires a large sized acceleration device, leading to a higher processing cost and a need for radiation protection. On the other hand, if the acceleration voltage is less than 1 kV, coating does not bond tightly to the substrate so that the product is not suitable for high-temperature sliding applications.

The results of x-ray diffraction measurements suggest that the preferred crystallite size is several nm to 100 nm. Thickness of the hard coating may be adjusted for each application but it is preferable that the thickness be less than several tens of micrometers because of cost and residual stress considerations.

The proportion of additives during the process of making the hard coating using the DM method can be adjusted by controlling the evaporation rate of Ti and the additive elements respectively. The face-centered cubic crystalline structure of TiN is produced by entering of nitrogen atoms in the Ti lattice as interstitial solid solution. When one or more of the elements Al, Cr, Zr or Hf is added to TiN, the face-centered cubic crystalline structure of TiN becomes irregular as the concentration of the additive element increases, and ultimately reaches an amorphous state or attains other crystalline structures. Therefore, to retain wear resistance and lower coefficient of friction, it is preferable that the total concentration of additive elements be not more than 30 atomic %. Also, studies to date indicate that the resistance to high-temperature corrosion is increased as the concentration of the additive element is increased, but it is preferable that the lower limit of concentration be determined so as to enable customizing the product to application conditions, in terms of the severity of corrosion of high-temperature steam or high-temperature air.

It is preferable that the crystals be oriented to (111) planes. It is possible to orient the crystals to (111) planes during the DM method, by controlling the implantation conditions of the nitrogen ion beam such as, for example, acceleration voltage, current density, implantation energy (W/cm$^2$), and the beam incidence angle.

On the other hand, the inventors have also developed a nitride-based material that is useable in sliding applications that do not demand high temperature strength. Such a sliding member comprises a substrate and a hard coating formed on the substrate, wherein the hard coating comprises a nitride-based material containing substantially TiN and at least one element selected from a group consisting of B and Si, and having a face-centered cubic crystalline structure comprising crystallites of an average size of not more than 9 nm. The process leading to such a concept is outlined below.

For the purpose of improving the hardness of TiN coatings and wear resistance, the inventors have been investigating technologies for obtaining nitride-based coatings containing elements other than Ti and N as well as methods for producing such products. That is, the primary object is to improve the hardness and wear resistance by developing technologies for producing nitride-based thin films containing elements other than Ti and N. The result is a discovery that such a material has a face-centered cubic crystalline structure and contains substantially TiN and at least one element selected from the group containing B and Si, and Vickers hardness is higher than 3000 when the crystallite size is not more than 9 nm, and has the following composition, excepting inevitable impurities such as carbon, oxygen, etc.

A sliding member made of a second group of nitride-based materials has a chemical composition defined in a formula, excepting inevitable impurities: Ti$_{(100-x)}$Me$_x$ nitride compound where Me represents at least one element selected from the group consisting of B and Si, and x is in a range given by a relation: 2 atomic % $\leq x \leq 30$ atomic %.

As in the first group, such a member may be produced by the DM method, which allows metallic elements, Ti and additives, to be vapor deposited on a substrate in a vacuum while implanting nitrogen ions in the deposit. This method enables to produce a coated product having the coating adhering tightly to the substrate in a relatively low temperature process. It is preferable that the substrate have a low coefficient of thermal expansion of not more than 11×10$^{-6}$ so as to produce tight bonding, which can be met by stainless steels, such as SUS420J2 or SUS630, or nickel-based alloys such as Incoloy 909. The substrate may include other steel materials than the above referred. Also, for the purpose of making wear resistant parts or cutting tools, various ceramic materials such as Sic, Si$_3$N$_4$ and Al$_2$O$_3$ as well as super-hard alloys such as WC may be used.

It is preferable that the acceleration voltage for the ion beam be less than 40 kV, because a higher acceleration voltage requires a large sized acceleration device, leading to higher processing cost and a need for radiation protection. On the other hand, if the acceleration voltage is less than 1 kV, coating does not bond tightly to the substrate, and the product is not suitable for sliding applications. Thickness of the hard coating may be adjusted for each application but it is preferable that the thickness be less than several tens of micrometers because of cost and residual stress considerations.

The proportion of additives during the process of making the hard coating using the DM method can be adjusted by controlling the evaporation rate of Ti and the additive elements. The face-centered cubic crystalline structure of TiN is produced by entering of nitrogen atoms in the Ti lattice as interstitial solid solution. When one or more of the elements B and Si is added to TiN, as the concentration of the additive element increases, face-centered cubic crystalline structure of TiN becomes irregular, and ultimately attains other crystalline structures. Therefore, to retain superior wear resistance and lower coefficient of friction, it is preferable that the total concentration of additive elements be not more than 30 atomic %. Also, studies to date indicate that the hardness and wear resistance are increased as the concentration of the additive element is increased, but it is preferable that the lower limit of concentration be determined so as to enable customizing the product to the severity of sliding conditions.

It is preferable that the crystals be oriented to (111) planes. It is possible to orient the crystals to (111) planes during the DM method, by controlling the implantation conditions of the nitrogen ion beam such as, for example, acceleration voltage, current density, implantation energy (W/cm$^2$), and the beam incidence angle.

In the manufacturing process of the above described sliding members, it is permissible to form a hard coating on the substrate by simultaneously depositing in a vacuum Ti and at least one element selected from the group consisting of Al, Cr, Zr, Hf, B and Si on the substrate while irradiating the substrate with ion beams containing substantially nitrogen ions.

Another aspect of the present invention is a sliding mechanism comprising a combination of a movable member and a static member, wherein either the movable member or the static member is made of a sliding member according to any of claims 1 to 4 or made by a method according to claim 5, and a remaining member is made of a material containing carbon. The material containing carbon may be a material containing substantially carbon, a material infiltrated with carbon or a thin film containing carbon.

In a sliding member according to any of claims 1 to 4, a method according to claim 5 or a sliding mechanism according to claim 6 or 7, the substrate may be a metal material.

Another aspect of the present invention is a dressing tool comprising a sliding member according to any of claims 1 to 4, or comprising a sliding member made by a method according to claim 5.

BEST MODE FOR CARRYING OUT THE INVENTION

This invention will be illustrated in terms of the preferred embodiments described in the following.

First, a dynamic ion beam mixing (DM) film deposition apparatus will be explained with reference to FIG. 1. The apparatus comprises a hermetic film deposition chamber 11 containing: a copper holder 12 for holding a substrate W on its bottom surface; vapor sources 13, 14 having respective heaters 13a, 14a and disposed below the holder 12; and an ion source 15 to irradiate ions to the substrate w from below by an oblique incident angle. A rotation shaft 16 is provided to rotate the substrate W so as to deposit a film uniformly, and the copper holder 12 is cooled by circulating water flowing through the rotation shaft 16 to prevent the substrate temperature from rising due to ion bombardment.

Using this film deposition apparatus, comparative tests were carried out using two types of substrates, SUS4202J2 steel and Incoloy 909, by depositing films according to the following procedure. In the first group of test specimens, at least one element selected from a group of metals, Al, Cr, Zr and Hf, is contained in Ti in a ratio of 2~30 atomic %, and in a second group of test specimens, at least one element selected from a group of elements B and Si, is contained in Ti in a ratio of 2~30 atomic %. The substrate W is pre-treated by polishing the specimen surface to a mirror polish to attain an average surface roughness of less than 0.05 µm, and the process is finished by ultrasonic cleaning in alcohol. The cleaned substrate W was attached to the holder 12 of the DM apparatus shown in FIG.

First, the chamber 11 is evacuated to reach a vacuum of less than $1 \times 10^{-5}$ torr, and sputter cleaning of the specimen was performed using nitrogen ions irradiated at an acceleration voltage of 10 kV, ion current density of 0.2 mA/cm², and an incident angle of 45 degrees. Next, nitrogen ions were irradiated while controlling the current density in the ion beam source 15, and the vapor sources 13, 14 for respective Ti and additive element were heated with the heaters 13a, 14a. The process of deposition was continued while controlling the vaporization speed, until a film thickness of 4 µm is obtained. Film deposition conditions are shown in Table 1.

TABLE 1

Conditions for making hard coatings

| | |
|---|---|
| Ti deposition speed: | 0.1–3.0 nm/s |
| Additive element: | first group, one of Zr, Hf, Nb, Ta, Cr or Al second group, one of B or Si |
| Additive deposition speed: | 0.1–0.5 nm/s |
| Nitrogen incident angle: | 45 degrees |
| Acceleration voltage: | 10 kV |
| Beam current density: | 0.05–0.5 mA/cm² |
| Deposition pressure: | $5 \times 10^{-6}$–$5 \times 10^{-5}$ torr |

The compositions of the deposited coatings shown in Table 2 indicate that, in the first group, at least one element selected from a group of Al, Cr, Zr and Hf, is present in an amount ranging from 2~30 atomic %, and in the second group, either B or Si is contained in an amount ranging from 2~30 atomic %. In this table, the supply rate of additives is shown as a ratio given by, (Me deposition speed)/(Ti deposition speed). Coating thickness was controlled by monitoring the deposition thickness by a quartz oscillator. Comparative specimens were prepared in the same manner using substrates meeting a following condition: those that did not contain additive elements, those that do not form a face-centered cubic crystalline structure, those that are not within a range of lattice constants 0.414 to 0.423 nm, those that contain additives (Al, Cr, Cr, Zr and Hf) outside the range of 2~30 atomic % with respect to Ti, those that contain Nb and Ta in a range of 4~8 atomic % with respect to Ti.

TABLE 2

| Trial No. | Additive Me | Supply Ratio Me/Ti | Conc. of Me (at %) | Hardness (Hv) | Cryst. Struc. | TiN Latt. Plane | Latt. Const. (nm) |
|---|---|---|---|---|---|---|---|
| Case 1 | Al | 0.05 | 3.9 | 2500 | FCC | (111) | 0.4152 |
| Case 2 | Al | 0.10 | 9.1 | 2550 | FCC | (111) | 0.4159 |
| Case 3 | Cr | 0.03 | 4.4 | 2500 | FCC | (111) | 0.4166 |
| Case 4 | Cr | 0.05 | 5.9 | 3150 | FCC | (111) | 0.4162 |
| Case 5 | Cr | 0.10 | 13 | 2700 | FCC | (111) | 0.4152 |
| Case 6 | Cr | 0.27 | 26 | 2850 | FCC | (111) | 0.4200 |
| Case 7 | Hf | 0.03 | 3.0 | 2650 | FCC | (111) | 0.4218 |
| Case 8 | Hf | 0.05 | 5.3 | 3500 | FCC | (111) | 0.4200 |
| Case 9 | Hf | 0.27 | 21 | 2650 | FCC | (111) | 0.4200 |
| Case 10 | Zr | 0.05 | 5.3 | 2550 | FCC | (111) | 0.4164 |
| Case 11 | B | 0.05 | 7.4 | 4600 | FCC | (111) | ** |
| Case 12 | B | 0.03 | 5.8 | 4300 | FCC | (111) | ** |
| Case 13 | B | 0.36 | 22.8 | 4400 | FCC | (111) | ** |
| Case 14 | Si | 0.05 | 4.1 | 4600 | FCC | (111) | ** |
| comp. 1 | none | 0 | 0 | 3500 | FCC | (111) | 0.4162 |
| comp. 2 | Al | 0.30 | 35 | 2650 | FCC | (111) | 0.4218 |
| comp. 3 | Al | 0.50 | 52 | 1250 | * | * | * |
| comp. 4 | Cr | 0.50 | 61 | 2050 | * | * | * |
| comp. 5 | Hf | 0.10 | 11 | 2550 | FCC | (111) | 0.4235 |
| comp. 6 | Hf | 0.27 | 21 | 2250 | FCC | (111) | 0.4261 |
| comp. 7 | Hf | 0.50 | 54 | 3050 | * | * | * |
| comp. 8 | Nb | 0.05 | 5.5 | 3250 | FCC | (111) | 0.4178 |
| comp. 9 | Ta | 0.05 | 5.7 | 2400 | FCC | (111) | 0.4193 |

*a crystalline structure other than FCC (face-centered cubic)
**unable to determine because of broad diffraction pattern The properties of the various hard coatings thus obtained are also shown in Table 2. In the first group, all the hard coatings exhibited a (111) preferred orientation and the spacing between (111) planes remained within a range of 0.239~0.242 nm. The lattice constant obtained from these values of the inter-planar spacings indicated a range of 0.414~0.419 nm.

Figure 2:
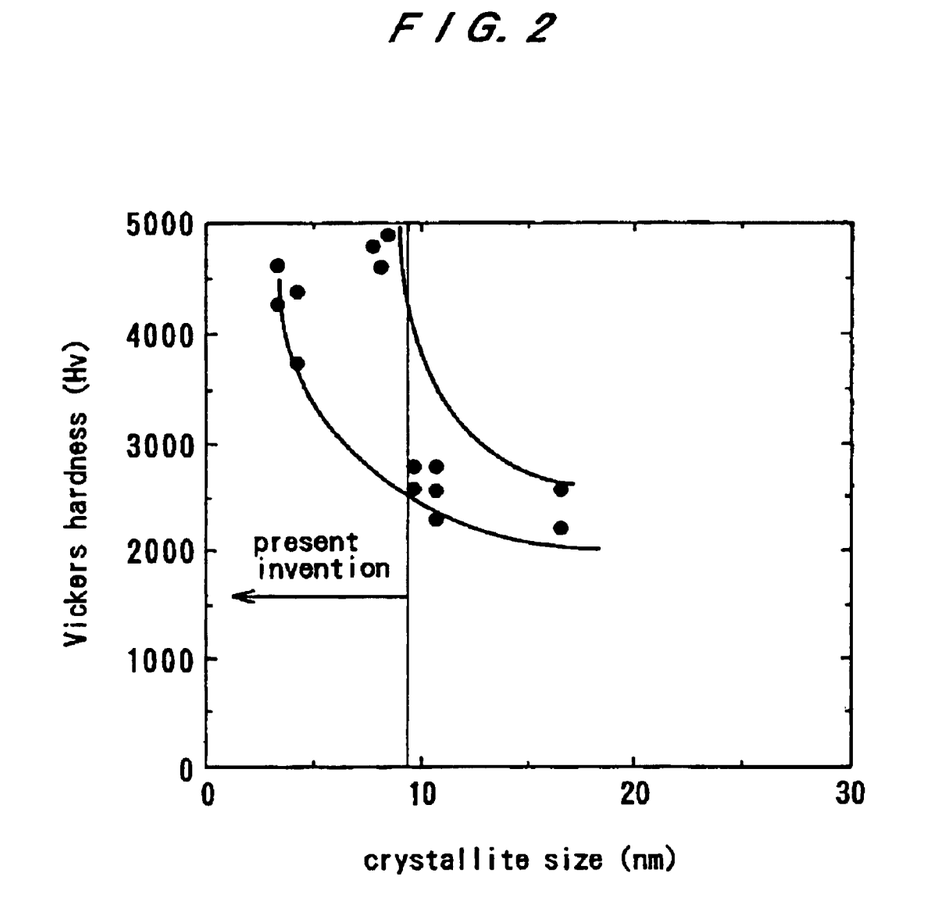
FIG. 2 is a graph showing the crystallite size and Vickers hardness values.

Also, FIG. 2 shows a relationship between the Vickers hardness and the size of crystallite for a number of various nitride-based coatings in the second group. The results of x-ray diffraction studies of the various nitride-based coatings indicated that the coatings are face-centered cubic, and have a (111) preferred orientation. The size of crystallite was obtained from a relation:

$$D=0.9\ \lambda/(\beta\cos\theta)$$

where D is a size of crystallite, $\lambda$ is an x-ray wavelength used, $\beta$ is a half width, $\theta$ is the Bragg angle for (111). As can be seen from these results, the sliding test specimens in the second group have high values of Vickers hardness in excess of 3500 and high resistance to sliding wear.

Figure 1:
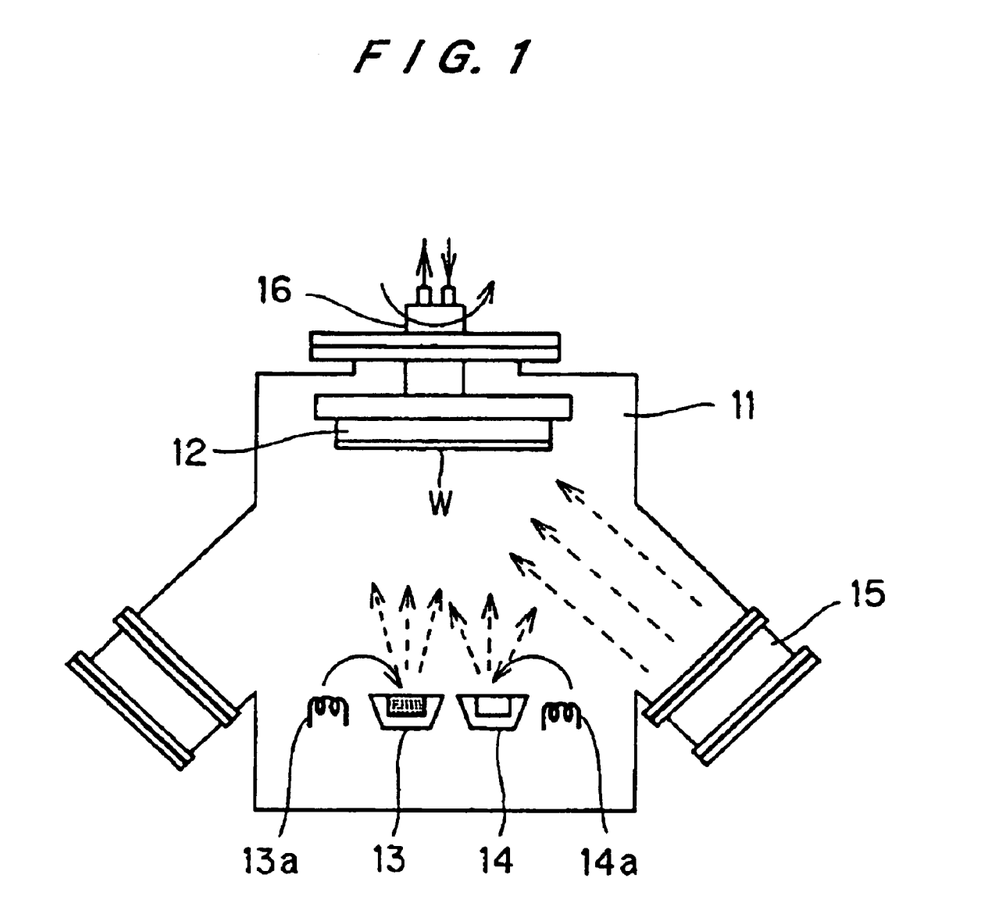
FIG. 1 is a schematic diagram of an apparatus for making the hard coating of this invention.
Figure 3:
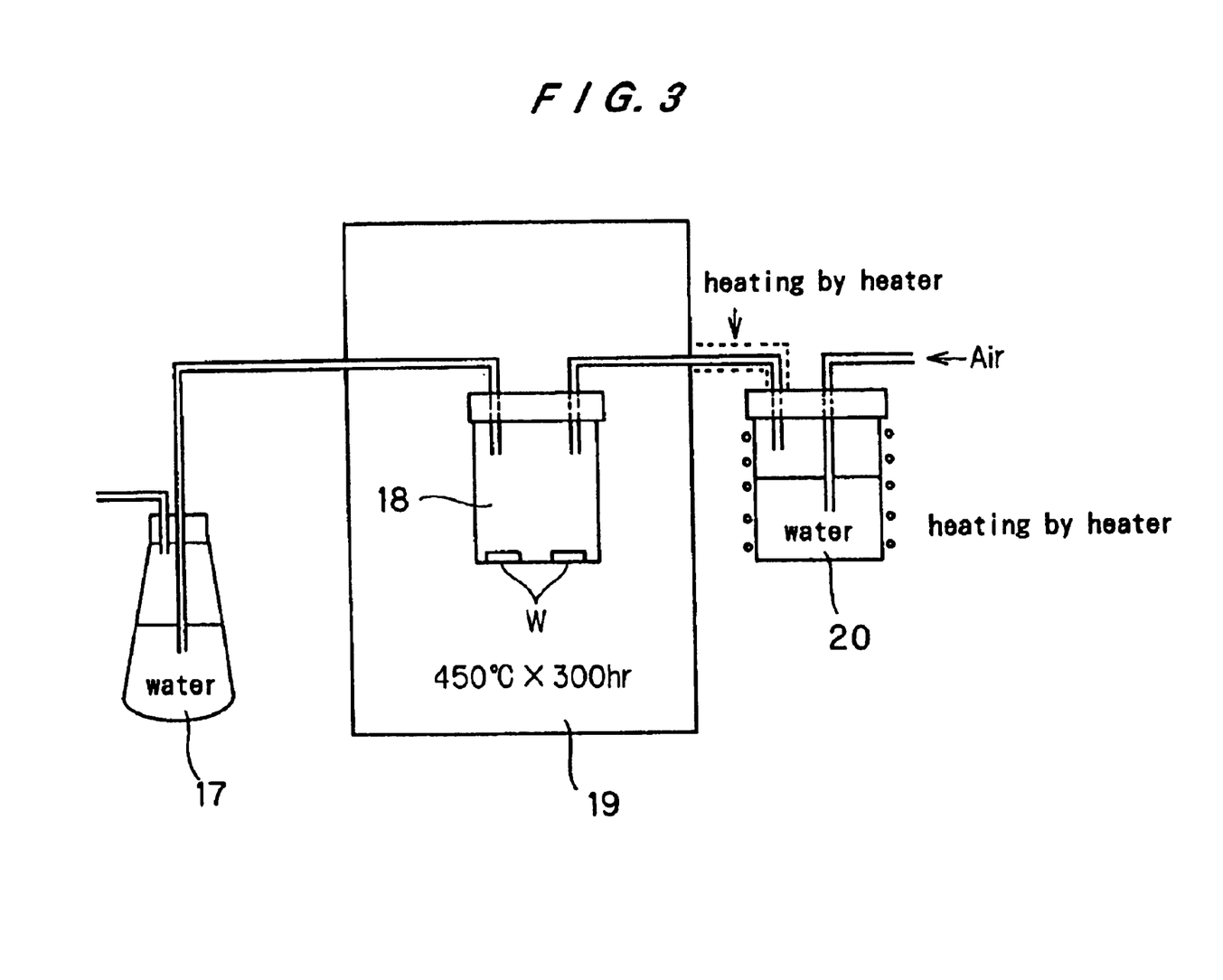
FIG. 3 is a schematic diagram of a high-temperature steam testing apparatus.

Next, TiN coatings of 0.1–3 µm thickness were first grown on the substrate in the apparatus shown in FIG. 1 without adding any additives, and then using the method described above, various elements were added to the nitride-based coating to obtain a final thickness of about 5 µm. The specimens were then subjected to high-temperature steam exposure tests. FIG. 3 shows a schematic view of the test apparatus comprising a trap 17, a holding case 18 for holding a substrate (specimen) W, a furnace 19 for maintaining the substrate W at a temperature, and a steam generator 20 for supplying steam to the substrate W. The specimen was held in the furnace for 300 hours at 450° C.

The exposed specimen was subjected to sputtering with Ar ions for a given length of time to remove the surface layer, and the sputtered surface was examined by x-ray photoelectron spectroscopy (XPS) to examine the composition. This process was repeated to determine the oxygen content at different depth to estimate the depth of corrosion reaction. Table 3 shows the results of such tests, which indicate that those nitride-based hard coatings containing added elements exhibit resistance to high-temperature corrosion.

TABLE 3

| Trial No. | Additives Me (atomic %) | Atomic Concentration | Resistance to High-temperature Corrosion |
| --- | --- | --- | --- |
| Case 1 | Al | 3.9 | ⊚ |
| Case 4 | Cr | 4.4 | ⊚ |
| Case 8 | Hf | 3.0 | ⊚ |
| Case 10 | Zr | 5.3 | Δ |
| Comparison 1 | none | 0 | Δ |
| Comparison 8 | Nb | 5.5 | X |
| Comparison 9 | Ta | 5.7 | X |

Figure 4:
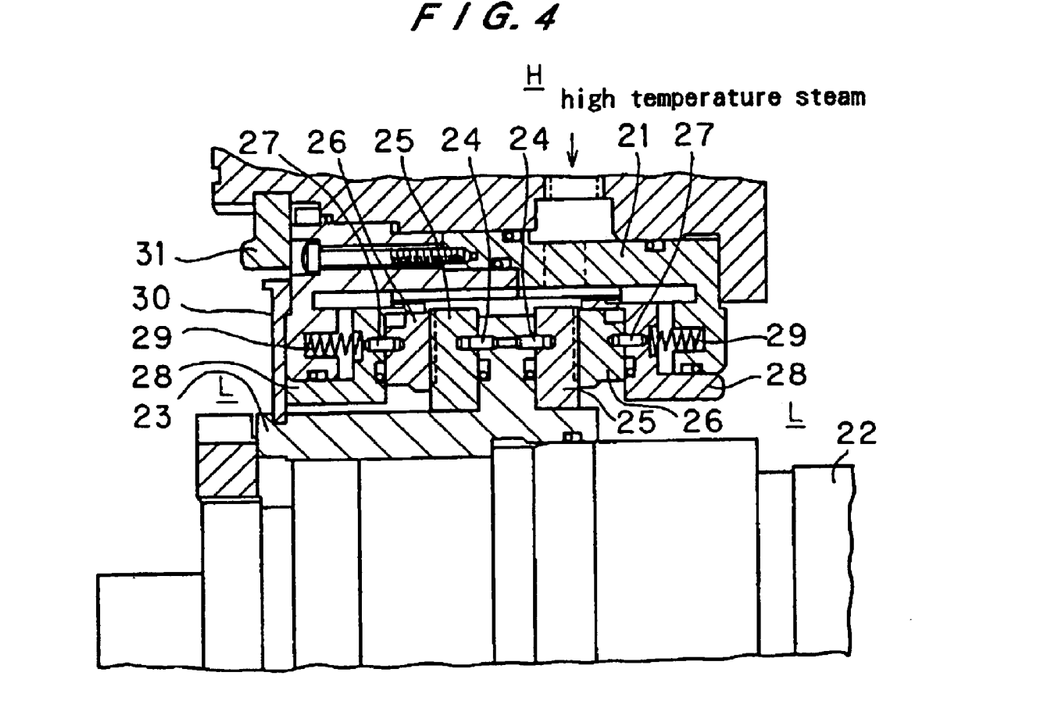
FIG. 4 is a diagram of a structure of a non-contacting end-face seal for a steam turbine.

X: corrosion thickness in excess of 0.3 µm
Δ: corrosion thickness in excess of 0.2 µm, less than 0.3 µm
◯: corrosion thickness in excess of 0.1 µm, less than 0.2 µm
⊚: corrosion thickness less than 0.1 µm Next, an application of this invention to a mating ring in a steam turbine will be explained. FIG. 4 shows an example of the structure of a non-contact end-face seal of a steam turbine. In FIG. 4, a rotation shaft 22 with a shaft sleeve 23 is housed in a seal housing 21. The shaft sleeve 23 holds rotation rings (mating rings) with keys 24. Each rotation ring 25 has an opposing fixed ring 26. The material for the rotation ring 25 is stainless steel (SUS420J2), and the sliding surface is coated with the high-temperature sliding wear resistant hard coating in the first group of this invention using the DM method. Although not shown in the drawing, a groove is formed on the sliding surface of the rotation ring 25 from the high pressure side H towards the low pressure side L.

Each fixed ring 26 is connected to a seal ring retainer 28 through a pin 27, and a spring 29 is provided between the seal ring retainer 28 and the seal housing 21. Each fixed ring 26 is pressed against the rotation ring 25 by means of the spring 29 and seal ring retainer 28. Here, a locking plate 30 and shearing key 31 are also provided.

The non-contact end-face seal of the above structure is operated by rotating the rotation shaft 22 so that the rotation ring 25 and the fixed ring 26 undergo relative motion and the groove provided on the rotation ring 25 swirls the fluid on the high-pressure side H and forms a fluid seal on the hermetic surface. Because of the fluid film, the hermetic surfaces are not in contact, and creates a minute space between the fixed ring 25 and the rotation ring 26. Here, the seal in FIG. 4 may be regarded to be in a normal compression state, and in such a case, the sliding wear resistance may be improved by applying the coating made by the DM method on the sliding surface of the rotation ring 25 in the second group.

Figure 5:
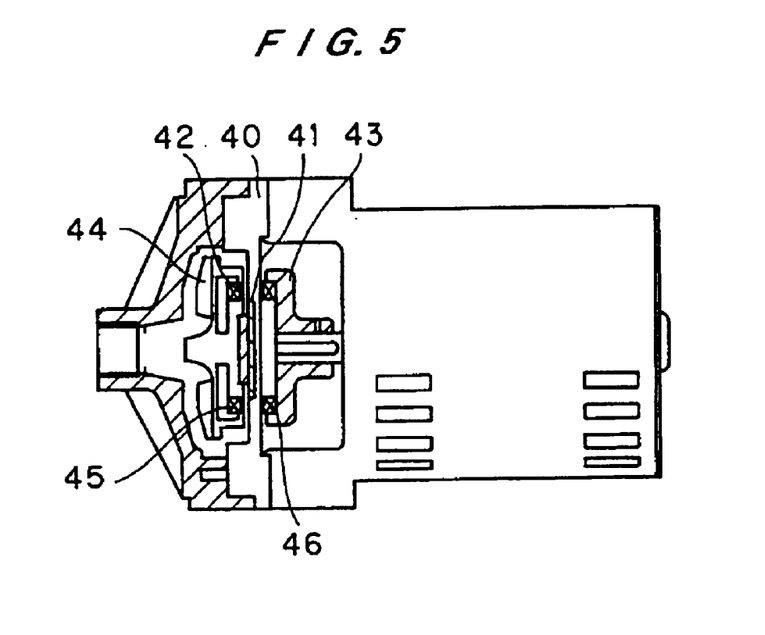
FIG. 5 is a diagram of a magnetic pump having the sliding member of this invention applied to a thrust bearing.

FIG. 5 shows an application of this invention to a thrust bearing in a magnetic pump. In FIG. 5, the thrust bearing comprises a static member 41 mounted on a dividing wall 40, and a movable member 42 facing the static member 41 and fixed on the impeller 44. A permanent magnet 46 is fixed on the magnetic coupling 43 via the dividing wall 40 and faces a permanent magnet 45 fixed on the impeller 44. Rotation of the magnetic coupling 43 is transmitted through the permanent magnets 46, 45 by the magnetic coupling force to the impeller 44 which rotates with a thrust support of the thrust bearing.

The hard coating of this invention of either the group 1 or group 2 is applied to the sliding surface of the movable member 42 constructing the thrust bearing through DM method. The static member 41 is made of a primarily carbon-based material. By making such a thrust bearing, a superior thrust bearing having a low friction coefficient and a low wear rate of carbon is obtained. Although not shown in the drawing, the sliding surface of the movable member of a radial bearing may also be coated with the hard coating of this invention and the static member may be made with a carbon-based material, thereby producing a similarly superior radial bearing.

Figure 6A:
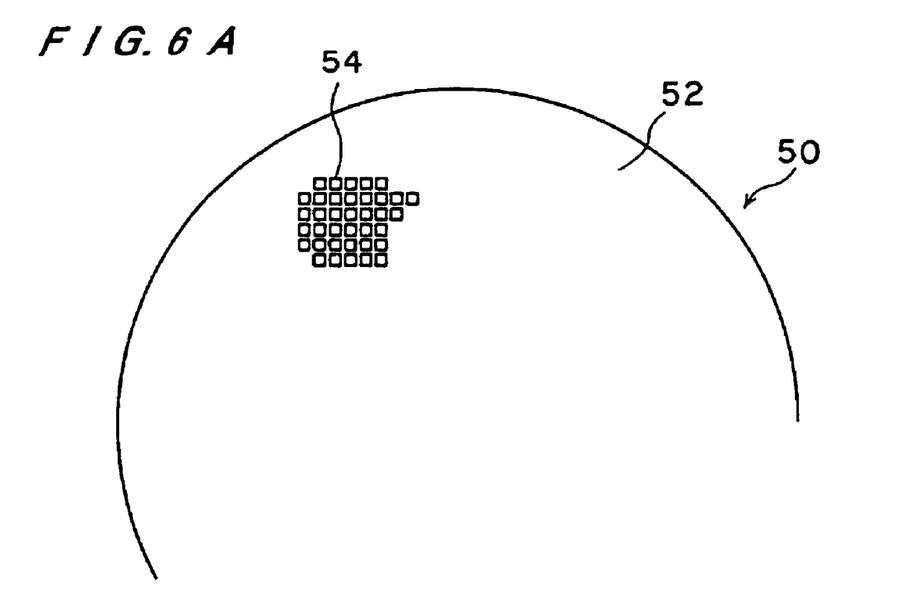
FIG. 6 is a diagram of a dressing tool having the sliding member of this invention.
Figure 6B:
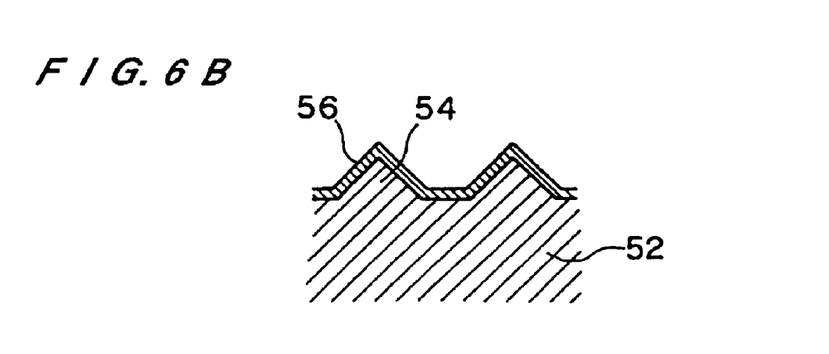

FIGS. 6A, 6B show another embodiment of this invention in which this invention is applied to a dressing tool for reconditioning a degraded surface of a chemical/mechanical polishing tool for producing a flat surface on a semiconductor substrate. The surface of a circular metal base 52 of the dressing tool is provided with protrusions 54 having an apex spacing of 0.3 mm and a height of 0.15 mm, and the protrusions are coated with the hard coating 56 of this invention in the first or second group using the DM method to produce surface protrusions having high hardness.

Figure 6C:
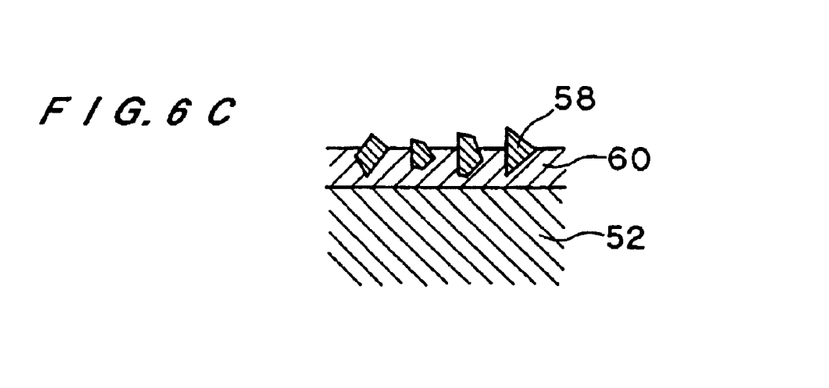

Such a dressing tool exhibits strong bonding between the base 52 and the hard coating 56 while maintaining the same or superior resistance to wear and sliding friction compared with the conventional dressing tool shown in FIG. 6C made by imbedding diamond particles 58 in an electro plated metal matrix 60, resulting in overall higher strength and durability.

It should be noted that although metal materials were used as a substrate, this invention is not limited to metal substrates, and super-hard alloys, ceramics may also be used to produced the same results.

Also, in the above embodiments, movable members of a bearing unit was made of metals, super-hard alloy or ceramic materials, and the hard coating of this invention was applied to the sliding surface of the member. However, the static member may be made of metals, super-hard alloys or ceramic materials, and the hard coating of this invention may be applied to the sliding surface and the movable member may be made of a carbon-based material.

Also, in the above embodiments, a material to be paired with sliding member having the hard coating of this invention was either resin-infiltrated hard carbon or hard carbon alone, but the pairing material is not limited to such a combination. A wide variety of carbon-based material can be used, including carbon-infiltrated materials. Carbon containing material may include carbon-based composite material. (carbon fiber reinforced composite material, carbon composite material), carbon steel, cast irons, carbide compounds (SiC, $Cr_3C_4$, TiC and the like), and carbon-group coatings (DLC film, TiC coating).

As explained above, according to the first group sliding member of this invention provides a hard coating for high-temperature sliding application having improved resistance to high-temperature corrosion while maintaining the excellent wear resistance and low friction properties of TiN coating. Also, according to the second group sliding member of this invention, the hardness of TiN coating and its wear resistance are further improved so that high resistance to sliding wear demanded as a result of higher speed and pressures used in rotating machines of today.

Industrial Applicability

This invention is applicable to high-temperature sliding components such as bearings and seals used in rotating machines operating high-temperature such as steam turbines, gas turbines, or to those elements such as cutting tools that require high resistance to wear and low friction properties.

What is claimed is:

1. A sliding member consisting essentially of a substrate and a hard coating formed on said substrate, wherein said hard coating consists essentially of titanium nitride and Cr, has a face-centered cubic crystalline structure with a lattice constant ranging from 0.414 to 0.423 nm in a crystal of said nitride-based material and has a Vickers hardness of not less than 2500 Hv.

2. A sliding member consisting essentially of a substrate and a hard coating formed on said substrate, wherein said hard coating consisting essentially of titanium nitride and B, has a face-centered cubic crystalline structure comprising crystallites of an average size of not more than 9 nm and has a Vickers hardness of higher than 3000 Hv.

3. A sliding member consisting essentially of a substrate and a hard coating formed on said substrate, wherein said hard coating consisting essentially of titanium nitride and at least one element selected from the group consisting of Zr and Hf, has a face-centered cubic crystalline structure with a lattice constant ranging from 0.414 to 0.423 nm in a crystal of said nitride-based material and has a Vickers hardness of not less than 2500 Hv.

4. A sliding member according to any of claims 1, 2 and 3, wherein said nitride-based material has a chemical composition defined in a formula, excepting inevitable impurities:

$Ti_{(100-x)}Me_x$ nitride compound where Me represents one element selected from the group consisting of Cr, Zr, Hf and B, and x is in a range given by a relation:

2 atomic %<x<30 atomic %.

5. A method for making a sliding member according to any of claims 1, 2 and 3, comprising the steps of: forming a hard coating on said substrate by simultaneously depositing in a vacuum Ti and at least one element selected, from the group consisting of Cr, Zr, Hf and B on said substrate while irradiating said substrate with ion beams containing substantially nitrogen ions.

6. A sliding mechanism consisting essentially of a combination of a movable member and a static member, wherein either said movable member or said static member is made of a sliding member according to any of claims 1, 2 and 3, or made by a method comprising the steps of: forming a hard coating on said substrate by simultaneously depositing in a vacuum Ti and at least one element selected from the group consisting of Cr, Zr, Hf and B on said substrate while irradiating said substrate with ion beams containing substantially nitrogen ions, and the remaining member is made of a material containing carbon.

7. A sliding mechanism according to claim 6, wherein said material containing carbon is a material containing substantially carbon, a material infiltrated with carbon or a thin film containing carbon.

8. A sliding member according to any of claims 1, 2, and 3, wherein said substrate is a metal material.

9. A method according to claim 5 wherein said substrate is a metal material.

10. A sliding mechanism according to claim 6, wherein said substrate is a metal material.

11. A sliding mechanism according to claim 7, wherein said substrate is a metal material.

12. A dressing tool consisting essentially of a sliding member according to any of claims 1, 2 and 3, or comprising a sliding member made by a method comprising the steps of: forming a hard coating on said substrate by simultaneously depositing in a vacuum Ti and at least one element selected from the group consisting of Cr, Zr, Hf and B on said substrate while irradiating said substrate with ion beams containing substantially nitrogen ions.

* * * * *

UNITED STATES PATENT AND TRADEMARK OFFICE
CERTIFICATE OF CORRECTION

PATENT NO. : 6,767,657 B2
DATED : July 27, 2004
INVENTOR(S) : Hiroyuki Uehara et al.

It is certified that error appears in the above-identified patent and that said Letters Patent is hereby corrected as shown below:

Title page,
Item [54], Title, change into -- A PACIFIER AND SHIELD PLATE THEREFORE --.

Column 14,
Line 14, please change "for being a user" into -- for facing a user --.

Signed and Sealed this

Twenty-first Day of December, 2004

JON W. DUDAS
*Director of the United States Patent and Trademark Office*